United States Patent
Frasch et al.

(10) Patent No.: US 10,634,700 B2
(45) Date of Patent: Apr. 28, 2020

(54) DUAL STRIPLINE TEST FIXTURE APPARATUSES AND METHODS

(71) Applicant: THE BOEING COMPANY, Chicago, IL (US)

(72) Inventors: Lydell L. Frasch, Dardenne Prairie, MO (US); Nathaniel Philip Roman, Ballwin, MO (US)

(73) Assignee: THE BOEING COMPANY, Chicago, IL (US)

( * ) Notice: Subject to any disclaimer, the term of this patent is extended or adjusted under 35 U.S.C. 154(b) by 72 days.

(21) Appl. No.: 15/956,417

(22) Filed: Apr. 18, 2018

(65) Prior Publication Data
US 2019/0324059 A1 Oct. 24, 2019

(51) Int. Cl.
*H01P 3/08* (2006.01)
*G01R 1/24* (2006.01)
*G05D 23/19* (2006.01)
*H01P 11/00* (2006.01)

(52) U.S. Cl.
CPC .......... *G01R 1/24* (2013.01); *G05D 23/1928* (2013.01); *H01P 3/088* (2013.01); *H01P 11/003* (2013.01)

(58) Field of Classification Search
CPC ..... H01P 3/088; H01P 3/085; G05D 23/1928; G01R 1/24
USPC ..................... 333/238, 246, 1, 4, 5
See application file for complete search history.

(56) References Cited

U.S. PATENT DOCUMENTS

| 4,538,124 A | * | 8/1985 | Morrison | H01P 1/00 174/535 |
| 5,351,001 A | * | 9/1994 | Kornrumpf | G01R 1/04 257/48 |
| 8,058,557 B2 | * | 11/2011 | Liu | H05K 1/0245 174/250 |
| 2017/0077578 A1 | * | 3/2017 | Baba | H01P 3/08 |

FOREIGN PATENT DOCUMENTS

JP          03-044307          *    4/1991   ............... H01P 3/08

OTHER PUBLICATIONS

Bogle et al., "High-Temperature RF Material Characterization Using a Dual-Chambered Rectangular Waveguide Fixture", IEEE Transactions on Instrumentation and Measurement, Sep. 2017, vol. 66, No. 9, 6 pages.

* cited by examiner

*Primary Examiner* — Stephen E. Jones
(74) *Attorney, Agent, or Firm* — The Small Patent Law Group, LL; Joseph M. Butscher (57) ABSTRACT

A dual stripline assembly includes a first stripline, a second stripline, and an intermediate member. The first stripline includes a first center conductor, first outer ground plane, and first inner ground plane. The first center conductor is spaced apart from and interposed between the first outer ground plane and the first inner ground plane. The first stripline extends along a length of the assembly. The second stripline includes a second center conductor, second outer ground plane, and second inner ground plane. The second center conductor is spaced apart from and interposed between the second outer ground plane and the second inner ground plane. The second stripline extends along the length of the assembly. The intermediate member extends along the length of the assembly, and includes the first inner ground plane and the second inner ground plane.

20 Claims, 6 Drawing Sheets

DUAL STRIPLINE TEST FIXTURE APPARATUSES AND METHODS

FIELD OF EMBODIMENTS OF THE DISCLOSURE

Embodiments of the present disclosure generally relate to test fixtures, such as for testing properties of a material that vary with temperature.

BACKGROUND OF THE DISCLOSURE

The electromagnetic (EM) properties of materials used at elevated temperatures may vary as temperature increases. Accordingly, materials or components that are to be used at elevated temperatures may be tested to determine how the EM properties of those materials or components behave at the elevated temperatures and/or vary with respect to temperature. Guided wave fixtures may be used to test EM properties of samples at elevated temperatures.

Characterization of materials (e.g., determination of EM properties) in a guided wave fixture at elevated temperatures requires that the entire fixture be immersed in a high temperature environment. Over time, the fixtures are subject to multiple temperature excursions (e.g., going from room temperature up to a highest measurement temperature and then back to room temperature). However, because temperature excursions of the fixture itself can affect the measurement values, a typical measurement process includes first measuring the empty fixture at each temperature set point to obtain a baseline measurement, and then repeating the measurements at each set point with the sample loaded in the fixture. Such a process requires two complete temperature cycles, which is time consuming, and also results in additional wear on and/or degradation of the test fixture. Further still, the potential for errors is increased because the baseline and sample data are collected at different times and under potentially different conditions.

SUMMARY OF THE DISCLOSURE

A need exists for improved measurement of temperature variability of properties (e.g., EM properties) of test samples. A need exists for testing EM properties of materials at elevated temperatures.

With those needs in mind, certain embodiments of the present disclosure provide a dual stripline assembly that includes a first stripline, a second stripline, and an intermediate member. The first stripline includes a first center conductor, first outer ground plane, and first inner ground plane. The first center conductor is spaced apart from and interposed between the first outer ground plane and the first inner ground plane. The first stripline extends along a length of the assembly. The second stripline includes a second center conductor, second outer ground plane, and second inner ground plane. The second center conductor is spaced apart from and interposed between the second outer ground plane and the second inner ground plane. The second stripline extends along the length of the assembly. The intermediate member extends along the length of the assembly, and includes the first inner ground plane and the second inner ground plane.

Certain embodiments of the present disclosure provide a method that includes providing a dual stripline test fixture, with the dual stripline test fixture including a first stripline comprising a first center conductor, first outer ground plane, and first inner ground plane, the first center conductor spaced apart from and interposed between the first outer ground plane and the first inner ground plane, the first stripline extending along a length of the assembly; a second stripline comprising a second center conductor, second outer ground plane, and second inner ground plane, the second center conductor spaced apart from and interposed between the second outer ground plane and the second inner ground plane, the second stripline extending along the length of the assembly; and an intermediate member extending along the length of the assembly, the intermediate member comprising the first inner ground plane and the second inner ground plane. The method also includes placing a sample in electrical contact with the conducting surfaces of the first stripline in a test zone of the dual stripline test fixture. Further, the method includes positioning the test zone of the dual stripline test fixture in a heating chamber. The method also includes heating the sample with the heating chamber. Also, the method includes providing a first signal to the first stripline and a second signal to the second stripline. The method further includes acquiring sample response signals from the first stripline, and acquiring baseline (calibration) response signals from the second stripline.

Certain embodiments of the present disclosure provide a testing system that includes a dual stripline test fixture, a heating chamber, rails, and a processing unit. The dual stripline test fixture includes a first stripline, a second stripline, and an intermediate member. The first stripline includes a first center conductor, first outer ground plane, and first inner ground plane, with the first center conductor spaced apart from and interposed between the first outer ground plane and the first inner ground plane, and with the first stripline extending along a length of the assembly. The second stripline includes a second center conductor, second outer ground plane, and second inner ground plane, with the second center conductor spaced apart and interposed between the second outer ground plane and the second inner ground plane, and with the second stripline extending along the length of the assembly. The intermediate member extends along the length of the assembly, and includes the first inner ground plane and the second inner ground plane. The rails are configured to support the dual stripline test fixture, wherein a test zone of dual stripline test fixture is configured to be advanced into the heating chamber along the rails. The processing unit is operably coupled to the heating chamber and to the dual stripline test fixture. The processing unit is configured to control the heating chamber, to provide a first signal to the first stripline, to provide a second signal to the second stripline, to acquire sample response signals from the first stripline, and to acquire calibration response signals from the second stripline.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Embodiments of the present disclosure provide a dual stripline test fixture that includes a pair of stripline transmission lines or striplines that share a common ground plane. During testing of a sample, one of the striplines is left empty while another is loaded with the sample, so that baseline data and test sample data may be collected concurrently. With the baseline (or calibration) data and test sample data collected concurrently, the overall time for the testing may completed in approximately half the time compared to using a conventional test fixture. Further, the test fixture is subjected to half as many temperature cycles over time as the test fixture is used with different samples, improving the lifespan and/or reliability of the test fixture. Accordingly, test times are reduced and cost savings are achieved.

In various embodiments, the test fixture may be mounted on a table that is movably coupled to a rail system with a set of rails that extend up to the first side of an oven and a second set of rails that extend up to the second side of the oven. In operation, various portions of the test fixture may be moved with respect to the oven to allow different portions of the test fixture to be heated and/or measured, and/or to allow test samples to be added into the test fixture or removed from the test fixture.

In some embodiments, supports may be utilized to support the center conductors of the striplines. The interior ends of the supports may be separated by a predetermined distance that defines a testing zone that is sized to enable the sample to be accurately tested. In various embodiments, the system is motorized and controlled by a computer such that a predetermined test algorithm may be installed on the computer, and the motor operated to move the test fixture along the rails and into the oven. The temperature of the oven and the amount of time that the test fixture is within oven may then be controlled by the controller. In some embodiments, the algorithm may define a series of temperature steps, with the oven heated in increments and data collected at each desired increment.

Figure 1:
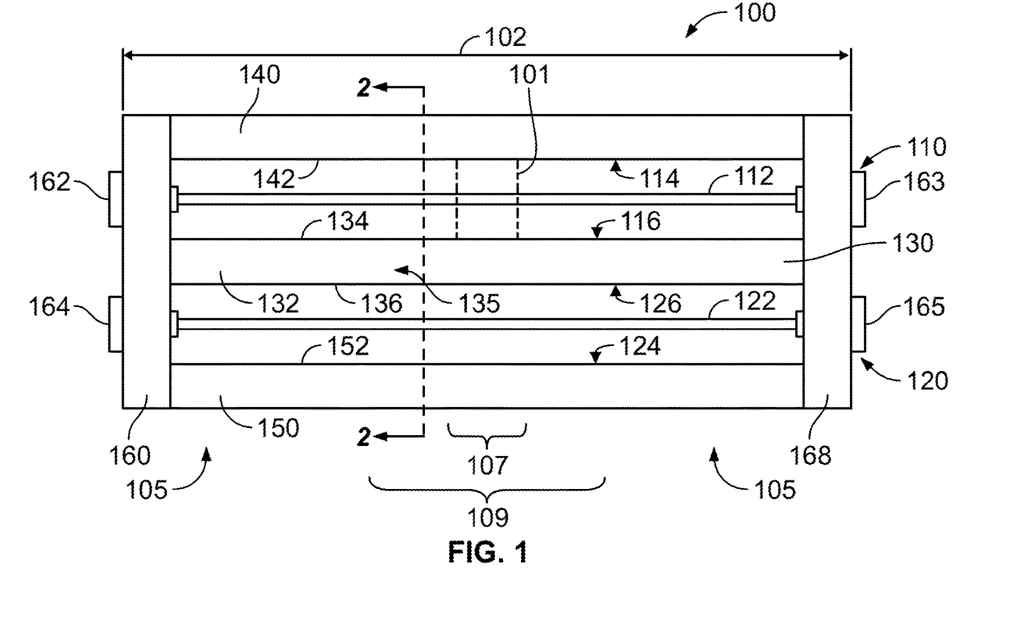
FIG. 1 provides a side view of a dual stripline assembly, according to an embodiment of the present disclosure.
Figure 2:
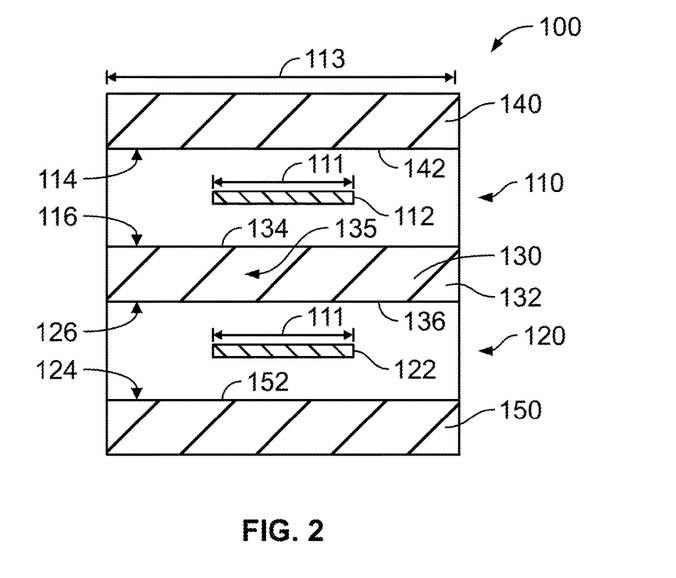
FIG. 2 provides a sectional view taken along line 2-2 of FIG. 1.

FIG. 1 provides a side view of a dual stripline assembly 100, and FIG. 2 provides a sectional view taken along line 2-2 of FIG. 1. As seen in FIGS. 1 and 2, the dual stripline assembly 100 includes a first stripline 110, a second stripline 120, and an intermediate member 130. Generally, the dual stripline assembly 100 allows for compact, efficient placement of two striplines. In some embodiments, the dual stripline assembly 100 is configured so that a sample 101 (depicted in phantom lines in FIG. 1) may be positioned in the first stripline 110, while no sample is positioned in the second stripline 120, allowing for simultaneous acquisition of test sample signals affected by the sample 101 (from the first stripline 110) and baseline or calibration signals not affected by the sample 101 (from the second stripline 120), for example with the sample 101 disposed in a heating chamber to test the temperature dependent variability of properties of the sample 101. It may be noted that, in connection with certain illustrated embodiments, the first stripline 110 will be referred to as being associated with the sample 101, and the second stripline 120 will be referred to as being used for calibration or not being associated with the sample 101; however, in other embodiments, the first stripline 110 may be used for calibration and the second stripline 120 used in connection with a test sample.

As seen in FIGS. 1 and 2, the first stripline 110 extends along a length 102 of the dual stripline assembly 100 (e.g., extends generally parallel to a direction corresponding to the length 102 of the dual stripline assembly over at least a portion of the length 102 of the dual stripline assembly 100), and includes a first center conductor 112, a first outer ground plane 114, and a first inner ground plane 116. It may be noted that, in connection with the illustrated embodiment, the terms "outer" and "inner" are used relative to a central or inner location defined by the intermediate member 130. Accordingly, the first inner ground plane 116 is closer to the intermediate member 130 than is the first outer ground plane 114. The first center conductor 112 is spaced apart from the first outer ground plane 114 and the first inner ground plane 116, and is interposed between the first outer ground plane 114 and the first inner ground plane 116. In the illustrated embodiment, the first center conductor 112 is interposed equidistantly between the first outer ground plane 114 and the first inner ground plane 116. The depicted first center conductor 112 of the illustrated example is separated from the first outer ground plane 114 and the first inner ground plane 116 by high temperature, low dielectric constant, low loss material at the ends of the stripline and with air in the test zone. Generally, the first stripline 110 provides a planar transmission line. For example, a signal may be transmitted via the first stripline 110 and return signals acquired from the first stripline 110. When the sample 101 is placed in electrical contact with the conducting surfaces of the first stripline 110, the sample 101 affects the returned and transmitted signals. It may be noted that the sample in various embodiments may be understood as being placed in intimate physical contact with the first stripline 110, with the conductive surfaces of the stripline touching all conductive surfaces of the sample.

The first center conductor 112 in various embodiments is a flat metal strip. The first center conductor 112 has a width 111, and extends along the length 102 of the assembly. The first center conductor 112 may be relatively thin. For example, in the illustrated embodiment, the first center conductor 112 is thinner than the intermediate member 130. The width 111 of the first center conductor 112 is less than the width 113 of the first outer ground plane 114 and the first inner ground plane 116.

When placed in the first stripline 110, the depicted sample 101 generally occupies the space between the first outer ground plane 114 and the first inner ground plane 116, and is in electrical contact (e.g., intimate electrical contact) with one or more aspects of the first stripline 110. The width of the sample 101, may be the same as or similar to the width 113 of the ground planes. (For example, the nominal width of the sample may be the same as a nominal width of the ground planes, with the widths varying within design and/or manufacturing tolerances). Accordingly, the sample 101 affects signals passing through the first stripline 110. The dual stripline assembly 100 may include a sample mounting fixture and/or mark to facilitate placement of the sample 101 in a predetermined location. The sample 101 may include one or more features that cooperate with one or more aspects of the first stripline 110 and/or a sample mounting fixture. For example, the sample 101 may have a slot that accepts the first center conductor 112, allowing the sample 101 to be slid into place from a side of the dual stripline assembly 100.

The second stripline 120, like the first stripline 110, extends along the length 102 of the dual stripline assembly 100. The second stripline 120 extends along the length 102 parallel (e.g., parallel within design and/or manufacturing tolerances) to the first stripline 110. The second stripline 120 is configured generally similar to the first stripline 110. For example, the second stripline 120 includes a second center conductor 122, a second outer ground plane 124, and a second inner ground plane 126. As seen in FIGS. 1 and 2, the second inner ground plane 126 of the depicted second stripline 120 is closer to the intermediate member 130 than the second outer ground plane 124. The second center conductor 122 is spaced apart from the second outer ground plane 124 and the second inner ground plane 126, and is interposed between the second outer ground plane 124 and the second inner ground plane 126. In the illustrated embodiment, the second center conductor 122 is interposed equidistantly between the second outer ground plane 124 and the second inner ground plane 126. The second center conductor 122 is separated from the second outer ground plane 124 and the second inner ground plane 126 by a high temperature, low dielectric, low loss material at the ends of the stripline and with air in the test zone. Generally, like the first stripline 110, the second stripline 120 provides a planar transmission line. For example, a signal may be transmitted via the second stripline 120 and the returned and transmitted signals acquired from the second stripline 120. It may be noted that no sample may be associated with the second stripline 120 in various embodiments. Accordingly, the second stripline 120 may be used to acquire a calibration signal or a baseline signal representing the response of the second stripline 120 (as well as the first stripline 110 which is generally similar to the second stripline 120), while the first stripline 110 is used to acquire the test or sample returned and transmitted signals. By comparing the calibration signals from the second stripline 120 to the test or sample signals of the first stripline 110, the effect of the sample 101 on the test or sample signals may be separated from a baseline effects provided by the calibration signals thus allowing that portion of the test or sample signals attributable to the sample 101 to be identified. It may be noted that the components of the first and second striplines (e.g., center conductors, outer plates) may be made of similar materials and similar sizes and shapes so that electrical signals transmitted via the first and second striplines are as similar as practical, allowing an acquired calibration returned and transmitted signals from the second stripline 120 to be treated as a baseline signals for the first stripline 110 (e.g., a signal that would have been acquired from the first stripline 110 if the first stripline 110 did not have the sample 101 associated therewith).

Similar to the first center conductor 112, the second center conductor 122 in various embodiments is a flat metal strip. The second center conductor 122 in the illustrated embodiment has the same width 111 as the first center conductor 112, and also extends along the length 102 of the assembly. (For example, the nominal width of the second center conductor 122 may be the same as a nominal width of the first center conductor 112, with the widths varying within design and/or manufacturing tolerances). The second center conductor 122 may be relatively thin. For example, in the illustrated embodiment, the first center conductor 112 and the second center conductor may have the same thickness and be thinner than the intermediate member 130. Also, it me be noted that the width of the second outer ground plane 124 and second inner ground plane 126 may be the same width (e.g., with 113) as the first outer ground plane 114 and the first inner ground plane 116. (For example, the nominal width of the second ground planes may be the same as a nominal width of the first ground planes, with the widths varying within design and/or manufacturing tolerances).

The depicted intermediate member 130 extends along the length 102 of the dual stripline assembly 100. As seen in FIGS. 1 and 2, the intermediate member 130 of the illustrated example extends parallel to the first center conductor 112 and the second center conductor 122 along the entirety of the length 102 of the dual stripline assembly 100, and is interposed between the first center conductor 112 and the second center conductor 122. The width of the intermediate member 130 in the illustrated embodiment is the width 113 (e.g., the width of the ground planes and the sample, or within design and/or manufacturing tolerances of the width of the ground planes and the sample). The intermediate member 130 includes both the first inner ground plane 116 and the second inner ground plane 126.

By having ground planes for two different striplines disposed on a common shared member (e.g., intermediate member 130), which may also be referred to herein as a shared ground plane, two striplines are provided in various embodiments in a more compact and/or more uniform arrangement than would be provided by two separate striplines (which would require two separate ground planes each or a total of four ground plane structures). Accordingly, both striplines may be utilized in a more compact environment. For example, both striplines may be placed simultaneously in a heating chamber or kiln to save time otherwise required for a calibration measurement, while minimizing the volume of the heating chamber required, thereby providing for easier, quicker, and more cost efficient heating. In the illustrated embodiment, the first stripline 110 and the second stripline 120 are arranged in a vertical or stacked arrangement, with the first stripline 110 above the second stripline 120. Such an arrangement provides for convenient placing of the sample 101, which, for example, may be supported at least in part by the intermediate member 130. Other arrangements may be utilized in other embodiments. For example, the dual stripline assembly 100 may be rotated 90 degrees so that the first stripline 110 and the second stripline 120 are in a side-by-side or horizontal arrangement, with a separate fixture or structure used to support the sample 101.

As discussed above, the intermediate member 130 includes both the first inner ground plane 116 and the second inner ground plane 126. For example, the first inner ground plane 116 and the second inner ground plane 126 may be disposed on separate surfaces of the intermediate member 130. In the illustrated embodiment, the intermediate member 130 includes or is configured as an inner plate 132. The inner plate 132 has a first surface 134 and a second surface 136, with the second surface 136 opposite the first surface 134. The intermediate portion 130 has an internal portion 135 interposed between the first surface 134 and the second surface 136. As seen in FIGS. 1 and 2, the first surface 134 is oriented toward the first center conductor 112, and the second surface 136 is oriented toward the second center conductor 122. The first inner ground plane is disposed on the first surface 134, and the second inner ground plane 126 is disposed on the second surface 136. In various embodiments, the intermediate member 130 may be made of a material (e.g., metal) that is relatively highly electrically conductive (to provide for electrical conductivity of the ground planes) while having a relatively low thermal conductivity.

The outer ground planes of the striplines in various embodiments may be disposed on outer plates. For example, in the example illustrated in FIGS. 1 and 2, the dual stripline assembly includes a first outer plate 140 and a second outer plate 150. The depicted first outer plate 140 and second outer plate 150 have the same width 113 as the intermediate member 130. Also, the first outer plate 140 and the second outer plate 150 may be constructed from the same material as the intermediate member 130. The first outer plate 140 has a first inner surface 142 that is oriented toward the first center conductor 112 and the intermediate member 130, with the first center conductor 112 interposed between the first outer plate 140 and the intermediate member 130. The first outer ground plane 114 of the first stripline 110 is disposed on the first inner surface 142 of the first outer plate 140. The second outer plate 150 may be configured generally similarly to the first outer plate 140 (e.g., similar material, similar dimensions). The depicted second outer plate 150 has a second inner surface 152 that is oriented toward the second central conductor 122 and the intermediate member 130, with the second center conductor 122 interposed between the second outer plate 150 and the intermediate member 130. The second outer ground plane 124 of the second stripline 120 is disposed on the second inner surface 152 of the second outer plate 150. The first outer plate 140 and second outer plate 150 provide structural support and rigidity for the dual stripline assembly 100 in addition to providing the surfaces utilized for the outer ground planes.

Various embodiments utilize one or more end plates to join the intermediate member 130 and outer plates 140, 150. In addition to providing structural support and rigidity, the end plates may also be used to place various aspects of the striplines in electrical contact with each other (e.g., to electrically connect corresponding ground planes). The end plates, like the intermediate member and outer plates, may be made of a metal having relatively high electrical conductivity and relatively low thermal conductivity. In the illustrated embodiment, the dual stripline assembly 100 includes end plates 160 and 168 which are coupled to the intermediate member 130, first outer plate 140, and second outer plate 150. For example, the end plates 160, 168, intermediate member 130, first outer plate 140, and second outer plate may be joined by fasteners.

The dual stripline assembly 100 also includes a first signal port 162 mounted to the end plate 160 and a second signal port 163 mounted to the end plate 168, with the first signal port 162 and the second signal port 163 electrically coupled to the first center conductor 112. Further, the dual stripline assembly 100 also includes a third signal port 164 mounted to the end plate 160 and a fourth signal port 165 mounted to the end plate 168, with the third signal port 164 and fourth signal port 165 electrically coupled to the second center conductor 122. The signal ports provide for convenient coupling of the center conductors with wires for providing transmitted signals to be sent through the striplines and to acquire returned signals from the striplines. For example, with the sample 101 in place in the first stripline 110, a test sample signal may be sent to the first stripline 110, and a test sample return signal acquired from the first stripline 110, via the first signal port 162, and a transmitted signal acquired from the first stripline 110 via the second signal port 163. Similarly, with no sample associated with the second stripline 120, a calibration signal may be sent to the second stripline 120, and a calibration return signal acquired from the second stripline 120, via the third signal port 164, and a transmitted signal acquired from the second stripline 120 via the fourth signal port 165.

As best seen in FIG. 1, the dual stripline assembly 100 includes buffer zones 105, a test zone 107 and a loading zone 109. The buffer zones 105 are disposed proximate the end plates 160 and 168. For example, in various embodiments, the buffer zones 105 extend from the end plates 160 and 168 toward the interior of the dual stripline assembly 100 until a border with the loading zone 109 is reached. The test zone 107 is centered within the loading zone 109 and is configured to receive the sample 101. For example, the test zone 107 may include a marker for locating the sample 101 and/or a fixture for securing the sample 101 in a predetermined desired location, providing for consistent, uniform placement of samples in the dual stripline assembly 100, helping to provide consistency of test conditions for different samples tested at different times. When the test zone 107 is disposed in a heating chamber, the buffer zone 105 is outside of the heating chamber. The buffer zones 105 are configured to protect electrical components (e.g., signal ports and/or associated cabling) from becoming overly heated when the test zone 107 is heated. For example, in various embodiments, the length of the buffer zones 105, in connection with the low thermal conductivity of the various structural members (e.g., first outer plate 140, intermediate member 130, second outer plate 150, end plate 160) prevents the electronics associated with or mounted to the end plate 160 (e.g., first and third signal ports 162 and 164 and the associated cabling), and the electronics associated with or mounted to the end plate 168 (e.g., second and fourth signal ports 163 and 165 and the associated cabling) from becoming overly heated via conductive heating from the test zone 107 being heated. The test zone 107 is interposed (in the illustrated embodiment, interposed equidistantly) between the two buffer zones 105, with the buffer zone 105 adjacent to end plate 168 disposed in the heating chamber when the loading zone 109 and the test zone 107 are retracted from the heating chamber (e.g., for changing test samples).

As discussed herein, in various embodiments the center conductors are made of thin metal strips. As such, as the length of the center conductors increase due to heating, they become increasingly subject to bowing or flexing under their own weight, or, in the case of the first center conductor 112 of the illustrated embodiment, potentially under any additional force caused by the sample 101, depending on how the sample 101 is coupled to the first central conductor 112. Accordingly, in various embodiments, the dual stripline assembly 100 includes supports that are configured to be interposed between the center conductors and the corresponding ground planes. The supports may be made of a ceramic or other high temperature material that is electrically insulating.

Figure 3:
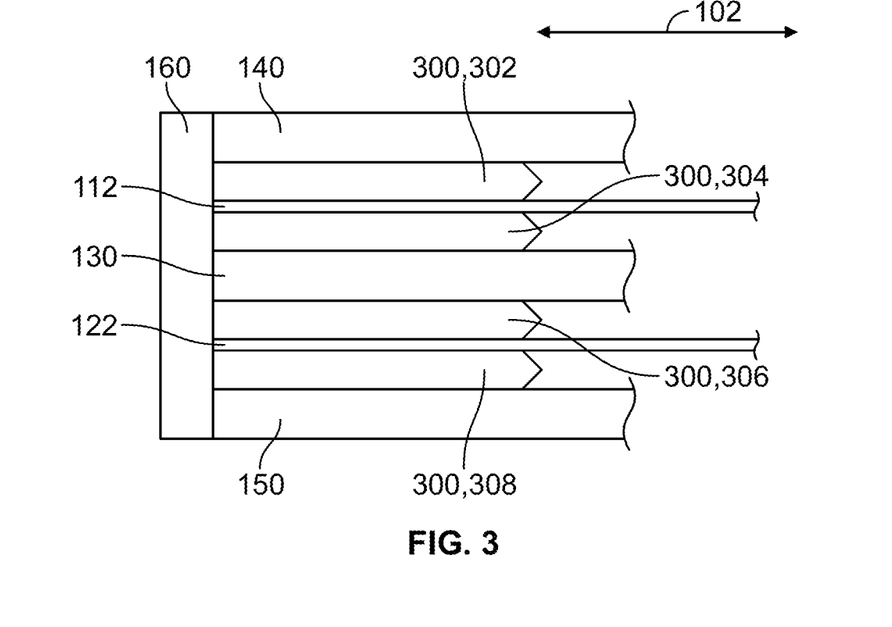
FIG. 3 provides a side view of end supports, according to an embodiment of the present disclosure.

FIG. 3 provides a side view of an embodiment of the dual stripline assembly 100 including end supports 300. In the illustrated embodiment, a first end support 302 is interposed between the first center conductor 112 and the first outer ground plane 114, and a second end support 304 is interposed between the first center conductor 112 and the first inner ground plane 116 (which is disposed on the intermediate member 130). Also, a third end support 306 is interposed between the second center conductor 122 and the second inner ground plane 126 (which is disposed on the intermediate member 130), and a fourth end support is interposed between the second center conductor 122 and the second outer ground plane 124. Generally the end supports 300 are sized to provided support to the center conductors by filling the space between the center conductors and the corresponding ground planes to help maintain the center conductors at or near parallel to the ground planes. While the end supports 300 are depicted in FIG. 3 as being positioned near the end plate 160 for ease of illustration, it may be noted that additional end supports 300 may be positioned proximate the opposite end of the dual stripline assembly 100 as well.

Figure 4:
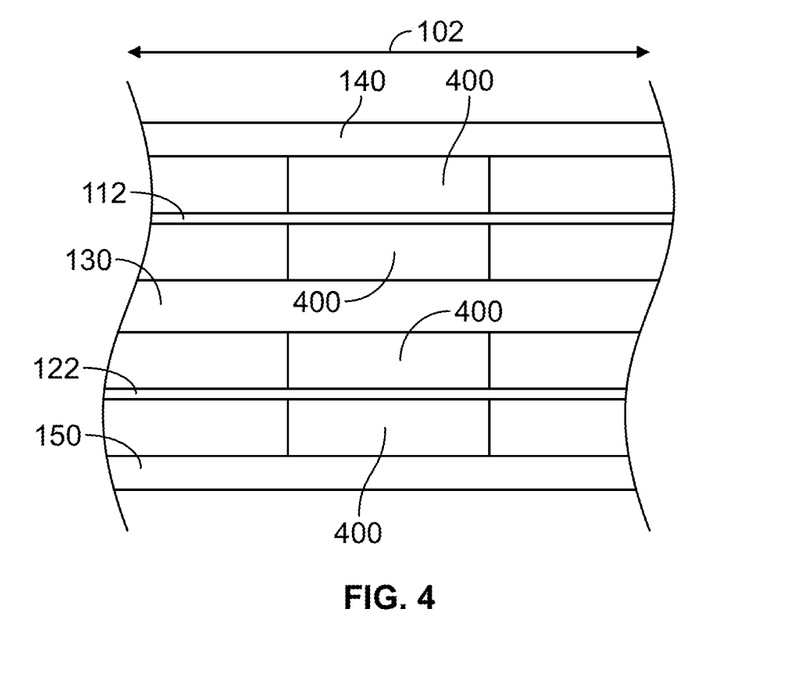
FIG. 4 provides a side view of intermediate supports, according to an embodiment of the present disclosure.
Figure 5:
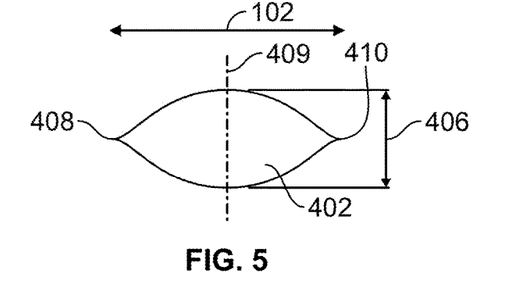
FIG. 5 provides a plan view of intermediate supports, according to an embodiment of the present disclosure.

FIG. 4 provides a side view of supports 400 configured to be used at one or more intermediate locations (e.g., away from the ends) of the dual stripline assembly, and FIG. 5 provides an overhead view of supports 400 formed in accordance with various embodiments. Similar to the supports 300, the supports 400 are configured to be interposed between the center conductors and corresponding ground planes, and provide support to help maintain the center conductors at or near parallel to the ground planes.

As seen in FIG. 5, the supports 400 of the depicted example include a tapered support 402 (e.g., some or all of the intermediately positioned supports 400 may be configured as a tapered support 402). The tapered support 402 has a width that varies along the length 102 of the dual stripline assembly 100. The depicted tapered support 402 has a maximum width 406 that corresponds to the width 111 of the first center conductor 112 and second center conductor 122 (for example, the maximum width 406 is the same as or less than the width 111; or, as another example, the maximum width 406 is the same as the width 111 within design and/or manufacturing tolerances). In the illustrated embodiment, the tapered support 402 increases width from a leading edge 408 until the maximum width 406 is reached at a central axis 409, with width decreasing from the maximum width 406 at the central axis 409 toward the trailing edge 410. In the illustrated embodiment, the tapered support 402 is symmetrical about the central axis 409, with the rate of increase or decrease from each leading edge toward the central axis 409 being the same. The tapering of the tapered support 402 along the length 102 in various embodiments helps reduce reflections of the signals as they travel along the striplines 110 and 120 and helps allow electromagnetic propagation. In various embodiments, the intermediate supports 400 may be positioned a predetermined distance from the sample 101 so as not to interact with the sample 101 and to minimize or reduce the effect on electromagnetic propagation near the sample 101.

Figure 6:
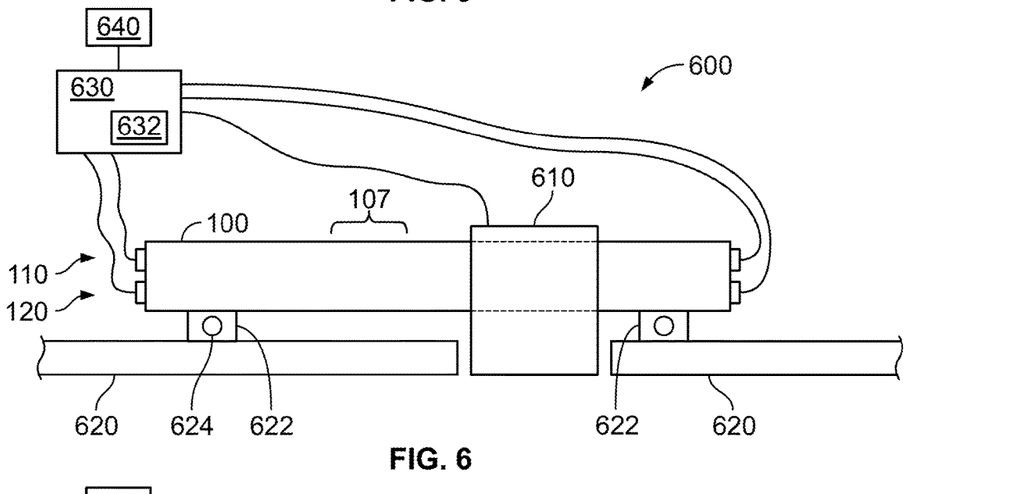
FIG. 6 provides a side view of a testing system with a test zone disposed outside of a heating chamber, according to an embodiment of the present disclosure.
Figure 7:
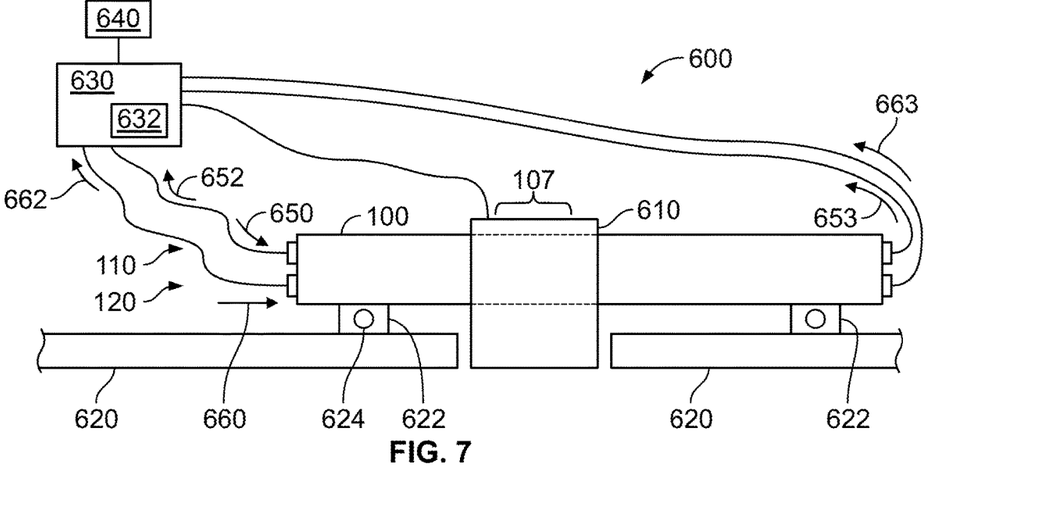
FIG. 7 provides a side view of the testing system of FIG. 6 with the test zone disposed inside of the heating chamber.

In various embodiments, the dual stripline assembly 100 may be used as part of a testing system that includes additional components. For example, FIGS. 6 and 7 illustrates a testing system 600 that includes a test fixture such as the dual stripline test assembly 100 (or similar fixture), a heating chamber 610, rails 620, and a processing unit 630. Generally, the testing system 600 is configured to move the test zone 107 of the dual stripline assembly 100 into and out of the heating chamber 610 to test the temperature variability of the EM properties (e.g., permittivity and permeability) of a sample 101 disposed within the test zone 107. The test zone 107 is out of the heating chamber 610 in FIG. 6 (e.g., for loading or unloading a sample 101 in the test zone 107), and the test zone 107 is in the heating chamber 610 in FIG. 7.

The heating chamber 610 is an oven or kiln configured to heat the sample 101. The amount of heat provided by the heating chamber 610 may be controlled by the processing unit 630. In various embodiments, the temperature of the heating chamber 610 may be incrementally controlled in a series of steps, for example, to allow the sample 101 to reach a series of stable temperatures, with measurements taken at each stable temperature used to determine the temperature variability of the EM properties of the sample 101.

The rails 620 in the illustrated embodiment are positioned on either side and adjacent to heating chamber 610, and are configured to support the dual stripline assembly 100 (or similar dual stripline test fixture). For example, carriages 622 may be mounted to the dual stripline test assembly 100, with the carriages 622 configured to translate along the rails 620 while supporting the dual stripline test assembly. The carriages 622, for example, may include wheels that roll along the rails 620 or guides that slide along the rails. A motor 624 or other motive device or actuator (e.g., cylinder or other linear actuator) may be mounted in various embodiments to one or more of the carriages 622, and controlled by the processing unit 630, to provide automated translation of the dual stripline assembly 100. Using the rails 620, the test zone 107 of the dual stripline assembly 100 may be advanced into the heating chamber 610.

The processing unit 630 is operably coupled to the heating chamber 610 and to the dual stripline assembly 100. The processing unit 630 is configured (e.g., programmed) to control the heating chamber 610. Also, as depicted in FIG. 7, the processing unit 630 is configured to provide a first signal 650 (e.g., a test sample input signal) to the first stripline 110 and receive a returned signal 652 from the first stripline 110, and to provide a second signal 660 (e.g., a calibration input signal) to the second stripline and receive a returned signal 662 from the second stripline 120. The processing unit 630 is also configured to acquire a sample response transmitted signal 653 from the first stripline 110 and to acquire a calibration response transmitted signal 663 from the second stripline 120. In various embodiments, the processing unit 630 analyzes the acquired signals to determine the EM properties of the sample 101 at the selected measurement temperatures. It may be noted that additional sensors (e.g., temperature sensors) may provide information to the processing unit 630. As the sample 101 is heated to a series of different temperatures (e.g., as determined using temperature sensors, or as determined based on an amount of time spent in the heating chamber 610 heated to a known temperature), sample response signals and calibration response signals may be acquired at each temperature, and used to determine the variation of properties of the sample 101 with changed in temperature.

For example, in various embodiments, as the sample 101 is heated to different temperatures, the processing unit 630 sends test signals and receives test returned and transmitted signals from the first stripline 110 to determine scattering parameters of first stripline 110 with the sample 101 associated therewith. At the same time (as the first and second striplines are in the heating chamber 610 at the same time), the processing unit 630 sends calibration signals and receives calibration returned and transmitted signals to determine scattering parameters of the second stripline 120 without sample 101 associated therewith at the same temperatures. By comparing the measured results (e.g., scattering parameters) of the striplines with and without the test sample at different temperatures, the processing unit 630 can use the temperature variability of the calibration signal to remove the effect of the stripline assembly on the signals received from the first stripline 110 with the sample 101, and to accordingly obtain the temperature variability of EM properties of the sample 101 with effects from the stripline structures removed. Because the first and second stripline are in the heating chamber 610 at the same time, consistent temperatures are used for both the test and calibration signals, and the amount of time is greatly reduced (e.g., cut in half or more) by removing the need for a separate calibration heating process that would be required if only one stripline were used.

It may be noted that the processing unit 630, while depicted as a single physical unit for ease of illustration, may include multiple physical units or devices in various embodiments. For example, one or more of a heating controller, signal generator (e.g., function generator), or signal analyzer may be disposed in a separate unit from other aspects of the processing unit 630.

In various embodiments the processing unit 630 includes processing circuitry configured to perform one or more tasks, functions, or steps discussed herein. As also discussed above, it may be noted that "processing unit" as used herein is not intended to necessarily be limited to a single processor or computer. For example, the processing unit 630 may include multiple processors, ASIC's, FPGA's, and/or computers, which may be integrated in a common housing or unit, or which may distributed among various units or housings. It may be noted that operations performed by the processing unit 630 (e.g., operations corresponding to process flows or methods discussed herein, or aspects thereof) may be sufficiently complex that the operations may not be performed by a human being within a reasonable time period. In the illustrated embodiment, the processing unit 630 includes a tangible, non-transitory memory 632 for storage of, among other things, instructions for causing the processing unit 630 to perform one or more steps or tasks discussed herein. The memory 632 may also store, for example, acquired signals (e.g., test sample return signals and calibration return signals) use for further processing or analysis and/or the results of the processing or analysis of the acquired signals (e.g., results describing the temperature variability of the sample 101). The depicted system 600 also includes a display unit 640 coupled to the processing unit 630, which may be used to display test results (e.g., via a display on a screen and/or a printed display).

Figure 8:
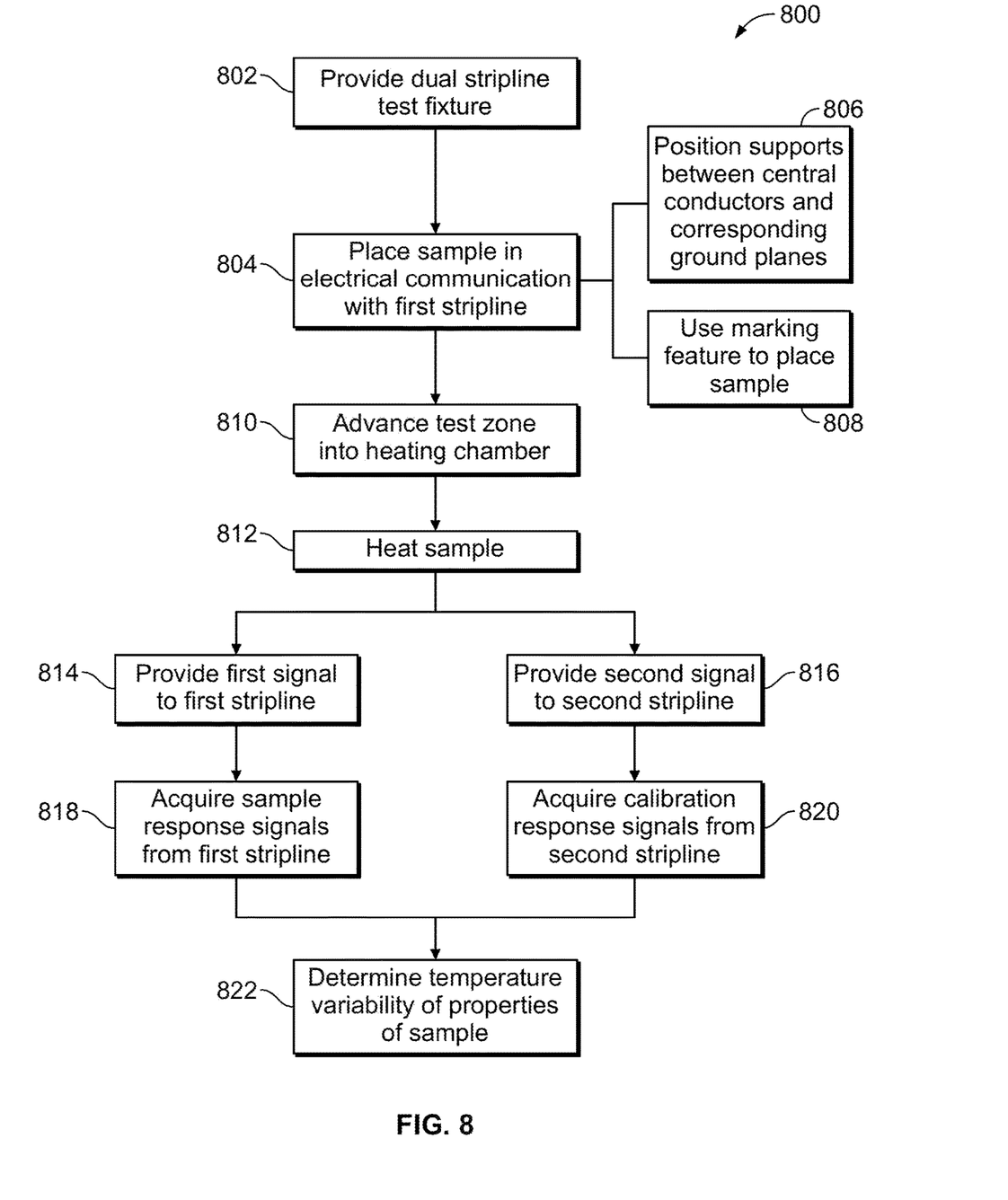
FIG. 8 illustrates a flow chart of a method, according to an embodiment of the present disclosure

FIG. 8 illustrates a flowchart of a method 800. The operations of FIG. 8 may be implemented by one or more processors (e.g., processing unit 630) executing program instructions stored in memory (e.g., memory 632). The method 800, for example, may employ structures or aspects of various embodiments (e.g., systems and/or methods) discussed herein, such as the system 600. In various embodiments, certain steps (or operations) may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 800 may be used as one or more algorithms to direct hardware to perform one or more operations described herein. It should be noted, other methods may be used, in accordance with embodiments herein.

At 802, a dual stripline test fixture (e.g., dual stripline assembly 100) is provided. Generally, the dual stripline test fixture includes two striplines sharing a common ground plane as discussed herein. Accordingly, the dual stripline assembly provides a compact test fixture that allows both a calibration stripline and a test sample stripline to be simultaneously measured while reducing the size requirement for an oven heating the sample.

At 804, a sample is placed in electrical contact with a first stripline (e.g., stripline 110) in a test zone (e.g., test zone 107) of the dual stripline test fixture. It may be noted that no sample is associated with a second stripline (e.g., stripline 120), allowing the first stripline to be used to test the sample and the second stripline used to obtain calibration or baseline results for identifying and removing effects of the stripline on the results obtained for the sample.

In the illustrated embodiment, at 806, supports are positioned between the central conductors and the corresponding ground planes of the dual stripline test fixture. For example, the supports may include tapered supports (e.g., tapered supports 402 described in connection with FIGS. 4 and 5 herein). At 808, a marking feature is used to place the sample. Use of a marking feature helps provide consistent placement of different samples in the same location of the test zone 107. In some embodiments, the marking feature may include a fixture that is physically coupled to the sample and helps secure the sample in a desired location.

At 810, the test zone of the dual stripline test fixture (with the sample in place) is advanced into a heating chamber (e.g., heating chamber 610). For example, the dual stripline test fixture may be disposed on a track (e.g., including rails 620), and the dual stripline test fixture may be advanced on the track to position the test zone in the heating chamber.

At 812, the sample is heated with the heating chamber. For example, the sample may be heated in a series of steps, allowing measurements to be taken at discrete, known temperatures as the sample is heated progressively to higher and higher temperatures.

At 814, a first signal is provided to the first stripline, and, at 816, a second signal is provided to the second stripline. The signals for example may have a known or predetermined waveform, and be transmitted along the first and second striplines. As the first signal traverses the first stripline, the first signal is affected by the sample associated with the first stripline. In contrast, as the second signal traverses the second stripline, there is no sample to affect the second signal. Accordingly, the first signal may be referred to as a test or sample signal, and the second signal referred to as a calibration or baseline signal.

At 818, sample response signals (e.g., a sample returned signal and a sample transmitted signal) are acquired from the first stripline, and, at 820, calibration response signals (e.g., a calibration returned signal and calibration transmitted signal) are acquired from the second stripline. It may be noted that the signals of 814 and 816 may be sent (and the signals of 818 and 820 acquired) at incremental time intervals corresponding to incremental steps at which the sample is heated. Accordingly, a series of sample response signals and corresponding calibration response signals may be correlated with particular temperatures.

At 822, temperature variability of properties (e.g., EM properties such as permittivity and permeability) of the sample are determined. For example, scattering parameters may be measured using the signals acquired at 818 and 820, and used to evaluate temperature response of the sample. In various embodiments, the calibration and sample signals are compared to isolate aspects of the measurements attributable to the sample with effects of the stripline removed to determine the properties of the sample.

Figure 9:
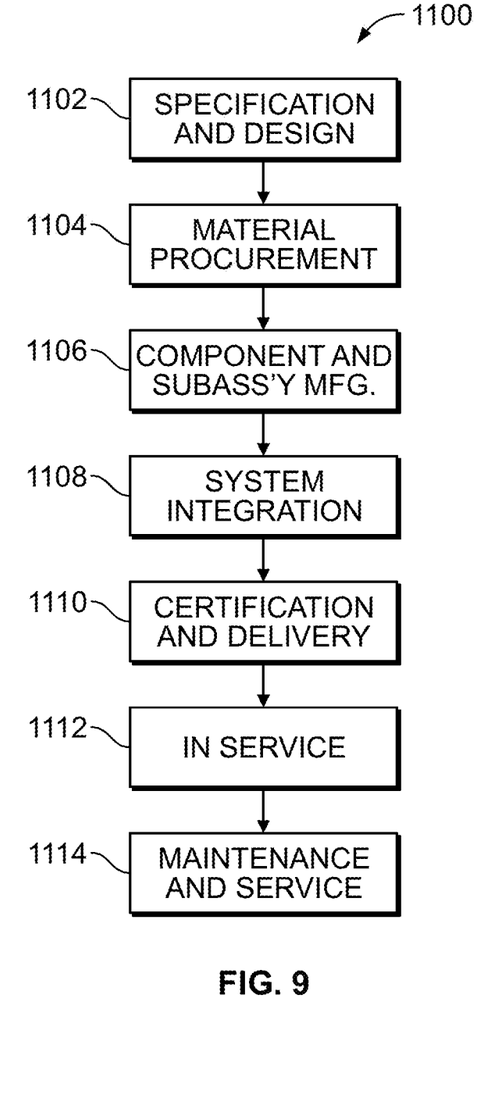
FIG. 9 is a block diagram of aircraft production and service methodology.
Figure 10:
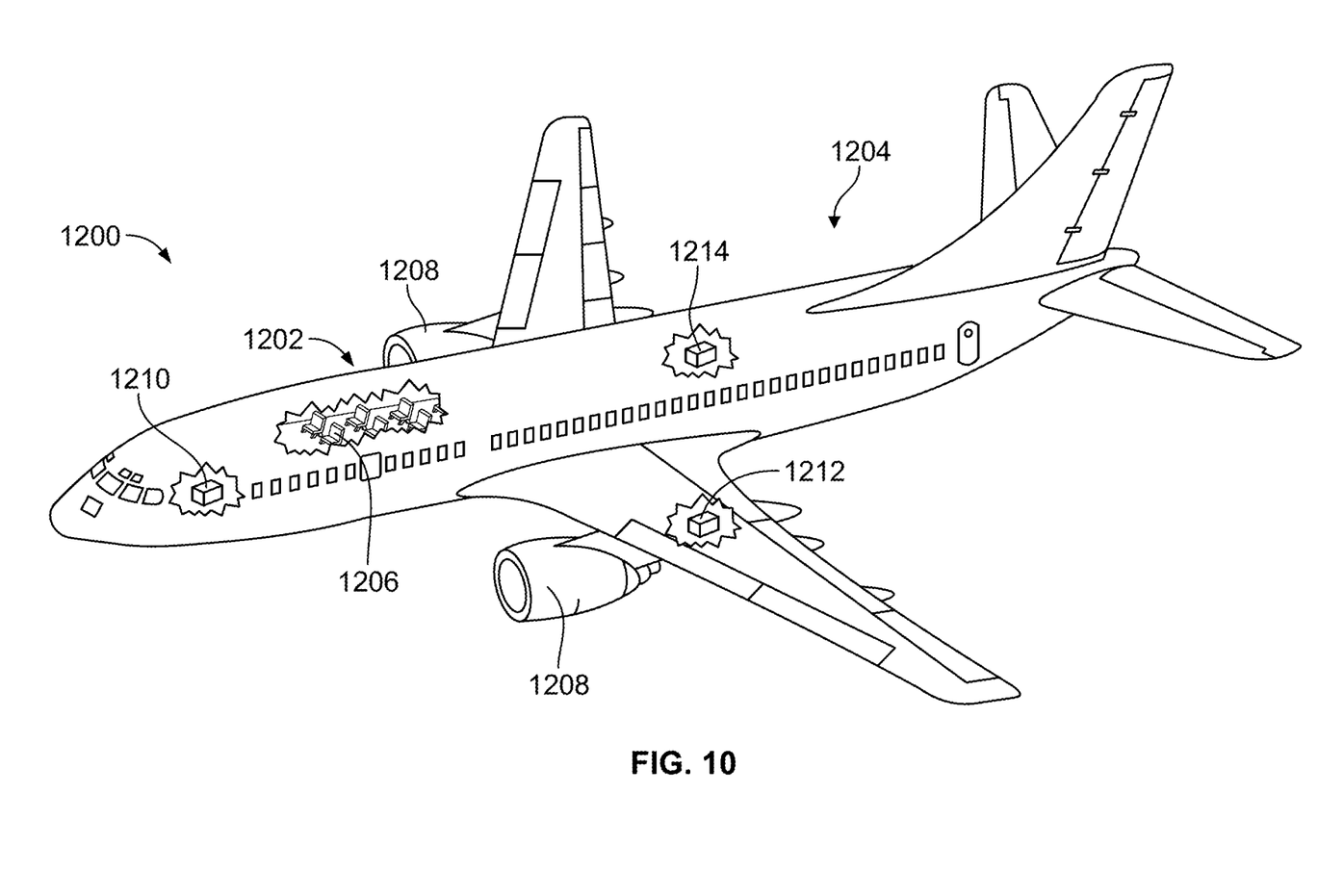
FIG. 10 is a schematic perspective view of an aircraft.

Examples of the disclosure may be described in the context of an aircraft manufacturing and service method 1100 as shown in FIG. 9 and an aircraft 1200 as shown in FIG. 10. During pre-production, illustrative method 1100 may include specification and design 1102 of the aircraft 1200 and material procurement 1104. During production, component and subassembly manufacturing 1106 and system integration 1108 of the aircraft 1200 take place. Thereafter, the aircraft 1200 may go through certification and delivery 1110 to be placed in service 1112. While in service by a customer, the aircraft 1200 is scheduled for routine maintenance and service 1114 (which may also include modification, reconfiguration, refurbishment, and so on).

Each of the processes of the illustrative method 1100 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 10, the aircraft 1200 produced by the illustrative method 1100 may include an airframe 1202 with a plurality of high-level systems 1204 and an interior 1206. Examples of high-level systems 1204 include one or more of a propulsion system 1208, an electrical system 1210, a hydraulic system 1212, and an environmental system 1214. Any number of other systems may be included. Although an aerospace example is shown, the principles of the invention may be applied to other industries, such as the automotive industry. Accordingly, in addition to aircraft 1200, the principles disclosed herein may apply to other vehicles, e.g., land vehicles, marine vehicles, space vehicles, etc.

Apparatus and methods shown or described herein may be employed during any one or more of the stages of the manufacturing and service method 1100. For example, components or subassemblies corresponding to component and subassembly manufacturing 1106 may be fabricated or manufactured in a manner similar to components or subassemblies produced while the aircraft 1200 is in service. Also, one or more aspects of the apparatus, method, or combination thereof may be utilized during the production stages 1106 and 1108, for example, by substantially expediting assembly of or reducing the cost of an aircraft 1200. Similarly, one or more aspects of the apparatus or method realizations, or a combination thereof, may be utilized, for example and without limitation, while the aircraft 1200 is in service, e.g., maintenance and service 1114.

As used herein, the term "control unit," "central processing unit," "unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, a processing unit may be or include one or more processors that are configured to perform various tasks or operations described herein.

It may be noted that the processing unit 630 may be configured to execute a set of instructions that are stored in one or more data storage units or elements (such as one or more memories such as memory 632), in order to process data. The data storage units may also store data or other information as desired or needed. The data storage units may be in the form of an information source or a physical memory element within a processing machine.

The set of instructions may include various commands that instruct the processing unit 630 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein illustrate one or more control or processing units, such as the processing unit 630. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A dual stripline assembly comprising:
    a first stripline comprising a first center conductor, first outer ground plane, and first inner ground plane, the first center conductor spaced apart from and interposed between the first outer ground plane and the first inner ground plane, the first stripline extending along a length of the assembly;
    a second stripline comprising a second center conductor, second outer ground plane, and second inner ground plane, the second center conductor spaced apart from and interposed between the second outer ground plane and the second inner ground plane, the second stripline extending along the length of the assembly;
    an intermediate member extending along the length of the assembly, the intermediate member comprising the first inner ground plane and the second inner ground plane; and
    tapered supports configured to be interposed between the center conductors and corresponding ground planes, wherein the width of the tapered supports varies along the length of the assembly, the tapered supports having a maximum width corresponding to a width of the first center conductor and second center conductor.

2. The dual stripline assembly of claim 1, wherein the tapered supports each define a central axis and are symmetrical about the central axis.

3. The dual stripline assembly of claim 1, wherein the intermediate member comprises an inner plate having a first surface and a second surface opposite the first surface, the first surface oriented toward the first central conductor and the second surface oriented toward the second central conductor, wherein the first inner ground plane is disposed on the first surface and the second inner ground plane is disposed on the second surface.

4. The dual stripline assembly of claim 3 further comprising:
    a first outer plate having a first inner surface, wherein the first center conductor is interposed between the first outer plate and the intermediate member, wherein the first outer ground plane is disposed on the first inner surface; and
    a second outer plate having a second inner surface, wherein the second center conductor is interposed between the second outer plate and the intermediate member, wherein the second outer ground plane is disposed on the second inner surface.

5. The dual stripline assembly of claim 4, further comprising:
    two end plates coupled to the intermediate member, first outer plate, and second outer plate;
    a first signal port and a second signal port mounted to the end plates and electrically coupled to the first central conductor; and
    a third signal port and a fourth signal port mounted to the end plates and electrically coupled to the second central conductor.

6. The dual stripline assembly of claim 5, further comprising buffer zones disposed proximate the end plates, and a test zone configured to receive a sample.

7. A testing system comprising:
    a dual stripline test fixture, the dual stripline test fixture comprising:
        a first stripline comprising a first center conductor, first outer ground plane, and first inner ground plane, the first center conductor spaced apart from and interposed between the first outer ground plane and the first inner ground plane, the first stripline extending along a length of the assembly;
        a second stripline comprising a second center conductor, second outer ground plane, and second inner ground plane, the second center conductor spaced apart from and interposed between the second outer ground plane and the second inner ground plane, the second stripline extending along the length of the assembly; and
        an intermediate member extending along the length of the assembly, the intermediate member comprising the first inner ground plane and the second inner ground plane;
    a heating chamber;
    rails configured to support the dual stripline test fixture, wherein a test zone of dual stripline test fixture is configured to be advanced into the heating chamber along the rails; and
    a processing unit operably coupled to the heating chamber and to the dual stripline test fixture, the processing unit configured to control the heating chamber, to provide a first signal to the first stripline, to provide a second signal to the second stripline, to acquire sample response signals from the first stripline, and to acquire calibration response signals from the second stripline.

8. The test system of claim 7, further comprising:
    supports configured to be interposed between the center conductors and corresponding ground planes.

9. The test system of claim 8, wherein the supports comprise tapered supports, wherein the width of the tapered supports varies along the length of the assembly, the tapered supports having a maximum width corresponding to a width of the first center conductor and second center conductor.

10. The test system of claim 7, wherein the intermediate member comprises an inner plate having a first surface and a second surface opposite the first surface, the first surface oriented toward the first center conductor and the second surface oriented toward the second center conductor, wherein the first inner ground plane is disposed on the first surface and the second inner ground plane is disposed on the second surface.

11. The test system of claim 10 further comprising:
a first outer plate having a first inner surface, wherein the first center conductor is interposed between the first outer plate and the intermediate member, wherein the first outer ground plane is disposed on the first inner surface;
a second outer plate having a second inner surface, wherein the second center conductor is interposed between the second outer plate and the intermediate member, wherein the second outer ground plane is disposed on the second inner surface;
end plates coupled to the intermediate member, first outer plate, and second outer plate;
a first signal port and a second signal port mounted to the end plates and electrically coupled to the first center conductor; and
a third signal port and a fourth signal port mounted to the end plates and electrically coupled to the second center conductor, wherein the processing unit is coupled to the first, second, third and fourth signal ports.

12. The test system of claim 11, further comprising buffer zones disposed proximate the end plates, and a test zone configured to receive a sample.

13. A dual stripline assembly comprising:
a first stripline comprising a first center conductor, first outer ground plane, and first inner ground plane, the first center conductor spaced apart from and interposed between the first outer ground plane and the first inner ground plane, the first stripline extending along a length of the assembly;
a second stripline comprising a second center conductor, second outer ground plane, and second inner ground plane, the second center conductor spaced apart from and interposed between the second outer ground plane and the second inner ground plane, the second stripline extending along the length of the assembly;
an intermediate member extending along the length of the assembly, the intermediate member comprising the first inner ground plane and the second inner ground plane, wherein the intermediate member comprises an inner plate having a first surface and a second surface opposite the first surface, the first surface oriented toward the first central conductor and the second surface oriented toward the second central conductor, wherein the first inner ground plane is disposed on the first surface and the second inner ground plane is disposed on the second surface;
a first outer plate having a first inner surface, wherein the first center conductor is interposed between the first outer plate and the intermediate member, wherein the first outer ground plane is disposed on the first inner surface; and
a second outer plate having a second inner surface, wherein the second center conductor is interposed between the second outer plate and the intermediate member, wherein the second outer ground plane is disposed on the second inner surface.

14. The dual stripline assembly of claim 13, further comprising:
two end plates coupled to the intermediate member, first outer plate, and second outer plate;
a first signal port and a second signal port mounted to the end plates and electrically coupled to the first central conductor;
a third signal port and a fourth signal port mounted to the end plates and electrically coupled to the second central conductor; and
buffer zones disposed proximate the end plates, and a test zone configured to receive a sample.

15. A method comprising:
providing a dual stripline test fixture, the dual stripline test fixture comprising:
a first stripline comprising a first center conductor, first outer ground plane, and first inner ground plane, the first center conductor spaced apart from and interposed between the first outer ground plane and the first inner ground plane, the first stripline extending along a length of the assembly;
a second stripline comprising a second center conductor, second outer ground plane, and second inner ground plane, the second center conductor spaced apart from and interposed between the second outer ground plane and the second inner ground plane, the second stripline extending along the length of the assembly; and
an intermediate member extending along the length of the assembly, the intermediate member comprising the first inner ground plane and the second inner ground plane;
placing a sample in electrical contact with the first stripline in a test zone of the dual stripline test fixture;
positioning the test zone of the dual stripline test fixture in a heating chamber;
heating the sample with the heating chamber;
providing a first signal to the first stripline and a second signal to the second stripline;
acquiring sample response signals from the first stripline; and
acquiring calibration response signals from the second stripline.

16. The method of claim 15, further comprising using a marking feature of the stripline assembly to place the sample.

17. The method of claim 15, further comprising disposing the dual stripline test fixture on a track and advancing the dual stripline test fixture on the track to position the test zone of the dual stripline test fixture in the heating chamber.

18. The method of claim 15, further comprising heating the sample in a series of increments.

19. The method of claim 15, further comprising positioning supports between the center conductors and corresponding ground planes.

20. The method of claim 19, wherein the supports comprise tapered supports, wherein the width of the tapered supports varies along the length of the assembly, the tapered supports having a maximum width corresponding to a width of the first center conductor and second center conductor.

* * * * *